(12) United States Patent
Gendrier et al.

(10) Patent No.: US 7,567,464 B2
(45) Date of Patent: Jul. 28, 2009

(54) NON-VOLATILE MEMORY DEVICE WITH PERIODIC REFRESH AND METHOD OF PROGRAMMING SUCH A DEVICE

(75) Inventors: Philippe Gendrier, Grenoble (FR); Philippe Candelier, Saint Mury (FR); Jean-Marc Tessier, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 269 days.

(21) Appl. No.: 11/654,383

(22) Filed: Jan. 15, 2007

(65) Prior Publication Data
US 2007/0183196 A1    Aug. 9, 2007

(51) Int. Cl.
*G11C 16/04*    (2006.01)
(52) U.S. Cl. .............................. 365/185.25; 365/185.09
(58) Field of Classification Search ............ 365/185.25, 365/185.09, 185.24
See application file for complete search history.

(56) References Cited

U.S. PATENT DOCUMENTS

| | | | |
|---|---|---|---|
| 5,671,180 A | 9/1997 | Higuchi | 365/185.21 |
| 6,201,742 B1 | 3/2001 | Hirai et al. | 365/189.09 |
| 6,639,839 B1 | 10/2003 | Chou et al. | 365/185.25 |
| 6,751,127 B1 | 6/2004 | Chou et al. | 365/185.25 |
| 7,397,697 B2 * | 7/2008 | So et al. | 365/185.09 |
| 2002/0110028 A1 | 8/2002 | Hassan et al. | 365/200 |
| 2002/0191465 A1 * | 12/2002 | Maayan et al. | 365/222 |
| 2003/0007402 A1 | 1/2003 | Chevallier | 365/201 |
| 2003/0103381 A1 | 6/2003 | Han et al. | 365/185.24 |
| 2004/0230879 A1 | 11/2004 | Crosby | 714/718 |

OTHER PUBLICATIONS

Preliminary Search Report, FR 06 00554, dated Aug. 24, 2006.

* cited by examiner

*Primary Examiner*—Vu A Le
(74) *Attorney, Agent, or Firm*—Gardere Wynne Sewell LLP

(57) ABSTRACT

A non-volatile memory device includes a network of non-volatile memory cells, each comprising a floating-gate transistor, said network of cells being intended to store data in the form of a set of data words. The device includes a circuit which detects loss of charges stored in the cells and then reprograms the cells for which a loss of charges has been detected so as to restore the level of stored charges.

22 Claims, 7 Drawing Sheets

NON-VOLATILE MEMORY DEVICE WITH PERIODIC REFRESH AND METHOD OF PROGRAMMING SUCH A DEVICE

PRIORITY CLAIM

The present application claims priority from French Application for Patent No. 06 00554 filed Jan. 20, 2006, the disclosure of which is hereby incorporated by reference.

BACKGROUND OF THE INVENTION

1. Technical Field of the Invention

The present invention relates to integrated circuits, and in particular electrically programmable and erasable non-volatile type memory devices. More particularly, the invention relates to a non-volatile memory device and a method of programming such a device.

2. Description of Related Art

A non-volatile memory device conventionally comprises a set of memory points arranged in the form of a network of memory cells used to store information in the form of a set of data words.

The structure of a non-volatile type memory point is well known to those skilled in the art. For this, reference can be made to U.S. Pat. No. 5,761,121, the disclosure of which is hereby incorporated by reference, which gives a description of this for a PMOS structure.

More specifically, a non-volatile memory cell is based on the use of a floating-gate transistor associated with a control gate which is used to control the transfer of charge carriers to the floating gate to be stored there permanently.

FIG. 1 shows the structure of a conventional non-volatile memory cell with floating-gate transistor. As can be seen in this figure, the floating gate FG of a cell C is made of polysilicon on top of a channel region which extends between two source S and drain D doped regions, referenced 2 and 3, located in a silicon substrate S, in this case of type P, with an interposed gate oxide layer 4. The control gate CG is formed on top of the floating gate FG with an interposed insulating film 5. Spacers 6 and 7 are provided either side of the floating gate and of the control gate.

As can be seen, the control gate is coupled capacitively to the floating gate. As for the floating gate, it is insulated such that the charges transferred to it remain stored until a high voltage is applied to the source, the drain and the substrate of the transistor and a much weaker voltage is applied to the control gate, which causes the appearance of a strong reversed electrical field followed by a draining of the electrons stored in the gate, passing through the gate oxide.

To program the memory cell, it is possible, for example, to perform a Fowler-Nordheim type programming, that is, to apply a strong electrical field to the control gate to lower the energy barriers and allow electrons to pass to the floating gate. With the application of the high electrical field to the floating gate, said floating gate is raised to a high potential. A voltage equal to 0 volts is then applied to a contact point of an active area of the substrate in which electrons are stored. Because of this, a strong electrical field is created which attracts the electrons from the active area to the floating gate through the gate oxide 4.

Non-volatile memory devices are designed for more or less permanent data storage. It has therefore been specified that the non-volatile memory cells must have data retention capacities such that they need to be able to remain in a programmed state for a time that can range up to several years.

However, the data retention capacities of the memory cells are linked to the thickness of the gate oxide used to insulate the floating gate. Thus, to be able to remain in the programmed state for the required time, the memory cells need to have a gate oxide layer at least 85 Angstroms thick. Below this value, the electrons stored in the floating gate are likely to pass through the polysilicon/oxide/silicon barriers to migrate towards the substrate. Such a phenomenon is generally called "tunneling".

Thus, if the thickness of the gate oxide is insufficient, there is a high probability that direct tunneling phenomena will appear, which is accompanied by a resulting loss of charges within the floating gate. This loss of charges is then likely to lead to a corruption of a stored binary value.

In view of the above, there is a need in the art to provide a non-volatile memory device in which the data retention capacity is enhanced.

There is also a need to allow for the creation of a non-volatile memory device with a thinner oxide layer.

There is still further a need to allow for the creation of a non-volatile memory device having an enhanced data retention with a gate oxide thickness that can range up to 50 Angstroms and this using a standard CMOS technology.

SUMMARY OF THE INVENTION

In accordance with a first aspect of the invention, a non-volatile memory device comprises a network of non-volatile memory cells, each comprising a floating-gate transistor, said network of cells being intended to store data in the form of a set of data words. According to a general characteristic of this device, the invention comprises means for periodically detecting loss of charges stored in the cells and means for reprogramming the cells for which a loss of charges has been detected so as to restore the level of stored charges.

According to another characteristic of the invention, the charge loss detection means comprise means for reading cells by comparing a cell read current with at least one first threshold value enabling a discrimination between a high logical level and a low logical level and means for comparing the data words read by comparing the read current with said first threshold value and the data words read by comparison with at least one second charge loss detection threshold value greater than the first threshold value.

The level of charges stored in the floating gates is thus restored before the charge losses create any corruption of the information stored.

According to yet another characteristic of the invention, the device also comprises an error correction block. Thus, even if an error appears in the stored bits, it can be corrected before the memory is refreshed. In an embodiment, the error correction block comprises an encoding block for generating a signature for a set of at least one word to be stored in the memory cells, said signature being intended to be stored in the network of memory cells and a decoding block for decoding said set of words and said corresponding signature.

According to yet another characteristic of the invention, the memory device comprises a data control block which communicates with the error correction block and with the network of memory cells to format the data intended for them. This data control block comprises means for generating the data words stored by copying, in redundant form, the data to be stored and the corresponding signatures according to characteristics of the network of memory cells.

In addition to the error correction block, the device makes it possible, by generating the words stored redundantly, to recover corrupted information, before refreshing. Thus, the memory device according to the invention comprises means for correcting errors in the stored words extracted from the network of cells by applying a logical operation between the redundant data.

According to a second aspect of the invention, a method is provided for programming a non-volatile memory device comprising a network of non-volatile memory cells, each comprising a floating-gate transistor, according to which the data is written into memory in the form of a set of data words. This method comprises: periodically detecting loss of charges stored in the cells; and rewriting the data in the cells for which a loss of charges has been detected so as to restore the level of charges stored.

In an embodiment of this method, for each word, the charge losses are detected by carrying out a first read of the cells by comparing the read current with a first threshold value enabling a discrimination between a high logical level and a low logical level, by performing a second read of the cells by comparing the read current with at least one second charge loss detection threshold value greater than the first threshold value, and by comparing the words resulting from the first and second reads.

This charge loss detection threshold value is a read current value between a current value corresponding to a programmed cell and a nominal read current value.

Advantageously, prior to the second read of the cells, an error correction algorithm is applied to correct the errors contained in the data words stored, the comparison step being carried out by comparing the corrected words and the words resulting from the second read.

According to another characteristic of the method according to the invention, the error correction algorithm is applied by encoding the data to be stored so as to generate a signature of said data and by decoding the signature and the corresponding data on reading.

According to yet another characteristic of the method according to the invention, the programming of the data in memory comprises: writing the data into the memory cells; and checking the programming by reading the data written by comparing the read current with the charge loss detection threshold value. If charge losses are detected, the written data is read a second time, by comparing the read current with the first threshold value enabling a discrimination between the high logical level and the low logical level.

For example, in an embodiment, in the case of a programming fault, the data is rewritten in the cells by applying a compensation voltage to active areas of the non-volatile memory device to which the charges stored in the floating gates are respectively transferred, on erasing the cell. It is also possible to have the written data rewritten so as to increase the level of charges stored in the floating gates.

In accordance with an embodiment, a non-volatile memory device comprises: a matrix of non-volatile memory cells, each cell being of a floating gate type which stores charge indicative of logic state; a read circuit that reads individual non-volatile memory cells to detect a loss of stored charge in those cells; and a programming circuit, responsive to read circuit detection of a loss of stored charge, which reprograms such non-volatile memory cells for which loss of stored charge is detected so as to restore charge.

In accordance with an embodiment, a method for programming a non-volatile memory device comprising a matrix of non-volatile memory cells, each cell being of a floating gate type which stores charge indicative of logic state, comprises: reading individual non-volatile memory cells to detect a loss of stored charge in those cells; and responsive to read circuit detection of a loss of stored charge, reprogramming such non-volatile memory cells for which loss of stored charge is detected so as to restore charge.

In accordance with another embodiment, a non-volatile memory device comprises: a matrix of non-volatile memory cells, each cell being of a floating gate type which stores charge indicative of logic state; a programming circuit operating to program logic states into individual memory cells of the matrix, the programming circuit storing charge of a desired logic state in each memory cell, and comprising a read circuit that reads the logic state of each programmed individual non-volatile memory cell in comparison to an expected logic state; wherein, if the read logic state matches the expected logic state, the programming circuit performs an additional programming of the same logic state into the memory so as to further increase a level of charge stored by the memory cell; and wherein, if the read logic state does not match the expected logic state, the programming circuit performs a repeat programming of the same logic state into the memory.

In accordance with another embodiment, a method for programming a non-volatile memory device comprising a matrix of non-volatile memory cells, each cell being of a floating gate type which stores charge indicative of logic state, comprises: programming logic states into individual memory cells of the matrix by storing charge of a desired logic state in each memory cell; reading the logic state of each programmed individual non-volatile memory cell; comparing the read logic state to an expected logic state; if the read logic state matches the expected logic state, then performing an additional programming of the same logic state into the memory so as to further increase a level of charge stored by the memory cell; and if the read logic state does not match the expected logic state, then performing a repeat programming of the same logic state into the memory.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
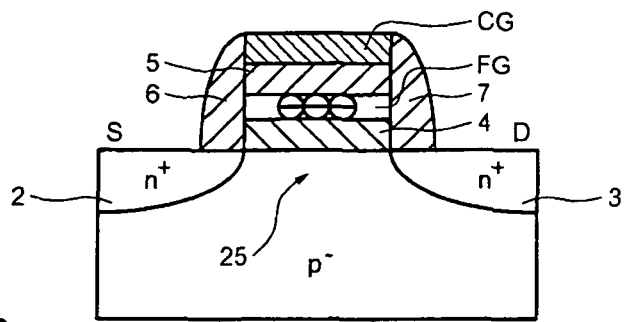
FIG. 1, already mentioned, diagrammatically illustrates the structure of a non-volatile memory cell.
Figure 2:
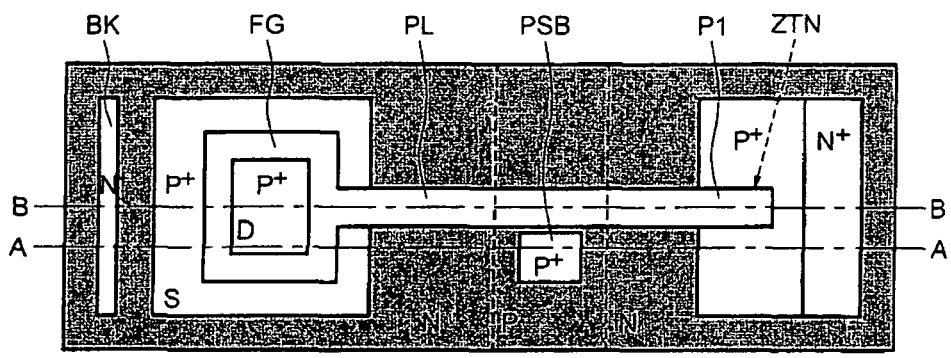
FIGS. 2, 2a and 2b diagrammatically illustrate an exemplary embodiment of a memory cell of a non-voltage memory device according to the invention.
Figure 2A:
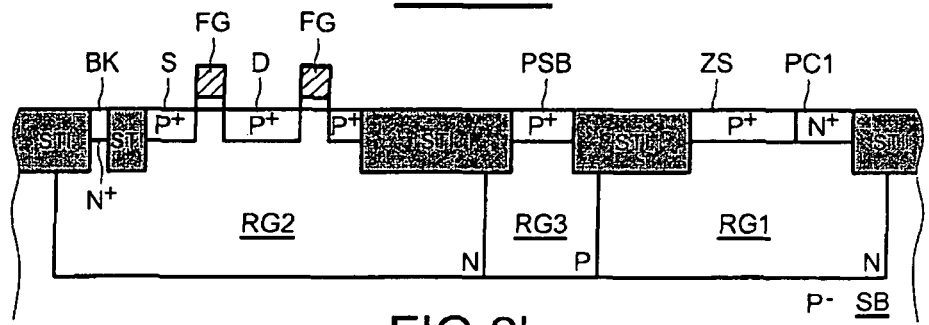
Figure 2B:
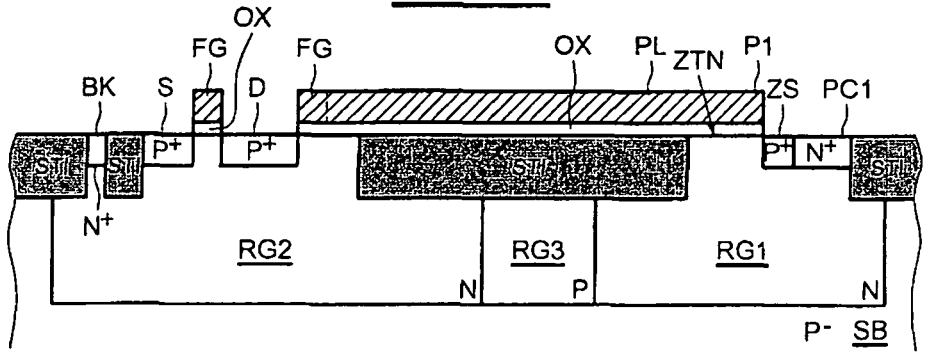

Reference is made first to FIGS. 2, 2a and 2b which illustrate an exemplary embodiment of a non-volatile memory device in which the control gate is produced by implementation in a semiconductor substrate. In these figures, FIGS. 2a and 2b are respectively cross sections along the lines A-A and B-B of FIG. 2.

The reference SB denotes a semiconductor substrate, in this case a P-doped silicon substrate of an integrated circuit. This substrate SB comprises a first substrate region RG1 formed by an N-doped semiconductor chamber, and a second substrate region RG2 formed by another N-doped semiconductor chamber. The two chambers RG1 and RG2 are separated by a third semiconductor region RG3 formed by a P-doped chamber. The chamber RG3 provides mutual electrical insulation depthwise for the two chambers RG1 and RG2. In practice, this electrical insulation is produced by the PN junctions that will be reverse biased.

On the surface, the mutual electrical insulation of the two chambers RG1 and RG2 is provided by an insulating region STI (Shallow Trench Isolation). The insulating region STI comprises an orifice opening out onto a $P_+$-doped contact point area PSB, located on the surface of the chamber RG3. This contact point PSB is intended to allow a biasing of the chamber RG3 and also of the underlying substrate SB.

The chamber RG1 forms a first active area in which is implemented a floating-gate transistor, while the chamber RG2 forms a second active area from which or to which the charges are transferred on programming and on erasing the memory cell, respectively. Above these two active areas, there is provided a layer of a gate material, for example polysilicon, resting on the surface of the two active areas through the intermediary of a gate oxide OX, for example silicon dioxide.

The layer of gate material, which, overall, forms a floating gate, comprises a first part P1 overhanging the first active area RG1. The layer of gate material also comprises an annular part FG disposed above the second active area RG2. This annular part of gate material defines the gate FG of a PMOS transistor, also called charge storage or read transistor, the source S of which, formed by a $P^+$ type implanted region, is located in the chamber RG2, outside the annular gate, and the drain D of which, also formed by a $P^+$ type implanted region, is located in the chamber RG2, inside the ring forming the gate FG.

The layer of gate material also comprises a link part PL linking the annular part FG and the first part P1. Advantageously, the geometry of the first part P1 has been chosen such that the capacitive value of the oxide area OX located under this first part P1, also called tunnel area ZTN, is less than or equal to 30% of the overall capacitive value between the layer of gate material and all of the active areas of the memory cell, that is, the sum of the capacitances formed between the gate material and each of the active areas of the memory cell.

Because of this, the source, drain and channel regions, which are capacitively coupled to the gate FG, will form a control gate for this memory cell, whereas the tunnel area ZTN will form a charge transfer area for draining, on erasing the memory cell, the charges stored in the floating gate to the first active area RG1.

Regarding the control gate, it is, of course, the channel area which is mainly involved in the capacitive coupling with the annular gate FG. That said, those skilled in the art know that the source and drain regions also overflow by diffusion under the annular gate FG. Also, these source and drain regions also participate in practice in this capacitive coupling.

In order to adequately bias the first active area RG1, said area comprises an $NP^+$-implanted area, referenced PC1, and used as a contact point.

Moreover, in the embodiment described, there is also provided a surface area ZS, $P^+$-doped, and extending around the tunnel area ZTN.

Those skilled in the art will have noted that there has thus been formed with the first part P1 of the layer of gate material, a short-circuited PMOS transistor, that is, one for which the source and drain regions, $P^+$-doped, are electrically linked.

This surface area ZS is electrically linked to the contact point area PC1, for example by surface siliconizing.

Regarding the second active area RG2, there is also provided an $N^+$-implanted region, referenced BK, enabling a contact point and a biasing of this chamber RG2, and, consequently, a biasing of the transistor substrate.

As is known, a memory cell is programmed, for example, by applying equal voltages to the source, the drain and the substrate of the transistor and of relatively high value, for example between 8 and 11 volts, typically 11 volts. In parallel, while the chamber RG3 is still biased at 0 volts, a voltage equal to 0 volts is applied to the contact point PC1 of the first active area.

Because of this, the floating gate is raised to a potential roughly equal to 10 volts, whereas the first active area is at 0 volts. There is therefore created a strong electrical field which will attract the electrons from the first active area RG1 to the floating gate through the oxide of the tunnel area ZTN. This type of programming is a Fowler-Nordheim type programming, according to which a strong electrical field is applied to lower the energy barriers and allow electrons to pass towards the floating gate.

There is also another possibility for electrically programming the memory cell, which consists in adopting a so-called "hot electron" programming. More specifically, to program the memory cell in this way, a voltage equal to 5 volts is applied, for example, to the source of the transistor, and a voltage equal to 0 volts to the drain. Moreover, the substrate of the transistor is biased to 5 volts and a voltage that can vary in practice between 0 and 5 volts, for example 5 volts, is applied to the contact point PC1 of the first active area. Also, the substrate (contact point PSB) is biased to 0 volts. The transistor is then switched on, subject to a gate/source voltage that is sufficient to initialize the conduction of the transistor, which creates a saturation of this transistor and provokes a hole current originating from the source. These holes come into collision with the crystalline network and form hot holes and hot electrons. The hot electrons are drawn into the floating gate, the potential of which drops slightly relative to that applied to the source.

Figure 3:
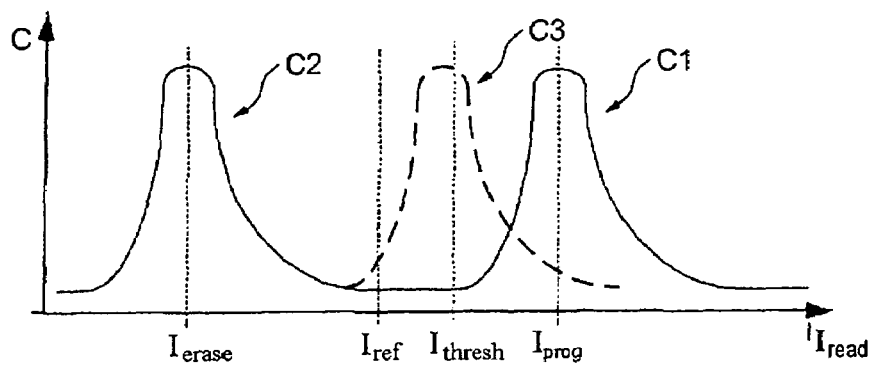
FIG. 3 is a curve illustrating the trend of the read current $I_{read}$ of a network of non-volatile memory cells in the programmed state on the one hand, in the erased state on the other hand, showing the trend of the read current in the case of a loss of charges.

FIG. 3 shows the trend of the transistor read current, on the one hand programmed and, on the other hand erased, for all of the cells C. As can be seen in this figure, the read current $I_{read}$, namely the drain/source current of the programmed memory cells, is distributed about a programming current $I_{prog}$, whereas the read current $I_{read}$ of the erased cells is distributed about a current $I_{erase}$ less than the programming current $I_{prog}$.

It is thus possible to know the state of a memory cell by comparing the read current with a reference current $I_{ref}$ making it possible to discriminate between the programmed cells and the erased cells.

As indicated previously, the memory cells need to have data retention capabilities such that they are capable of remaining in the programmed state for a duration lasting as long as 10 years.

Now, as can be seen in FIG. 3, "tunneling" processes, by which the stored charges are likely to migrate through the layer of oxide, are likely to appear, in particular when the oxide layer has a thickness of the order of 50 Angstroms, which is in particular the case when conventional fabrication technologies are used for transistors with gate widths of 65 nanometers and gate lengths of 90 nanometers. This tunneling effect thus generates charge losses in the floating gates, and a consecutive decrease in the read current of the cells affected.

As can be seen in FIG. 3, certain cells C3, previously programmed, can then present a read current less than the reference current $I_{ref}$ such that, for these cells C3, the read result is incorrect. To overcome this drawback, according to one aspect of the invention, when the device is in operation the cells are read periodically, before any losses cause a drop in read current below the reference current $I_{ref}$ and the cells that have been subject to a loss of charges are reprogrammed so that their current is increased to their initial level, or even, as will be seen below, to a higher level. Furthermore, according to a second aspect of the invention, an error correction algorithm and an encoding of the stored data in redundant form are applied, in order to limit the appearance of errors by correcting them after their appearance. In other words, according to the invention, a check is carried out to ensure that the read current of the population of programmed cells is greater than the current $I_{prog}$. Similarly, a check is carried out to ensure that the read current of the erased cells is less than the current $I_{erase}$, in order to check the integrity of the stored data.

Figure 4:
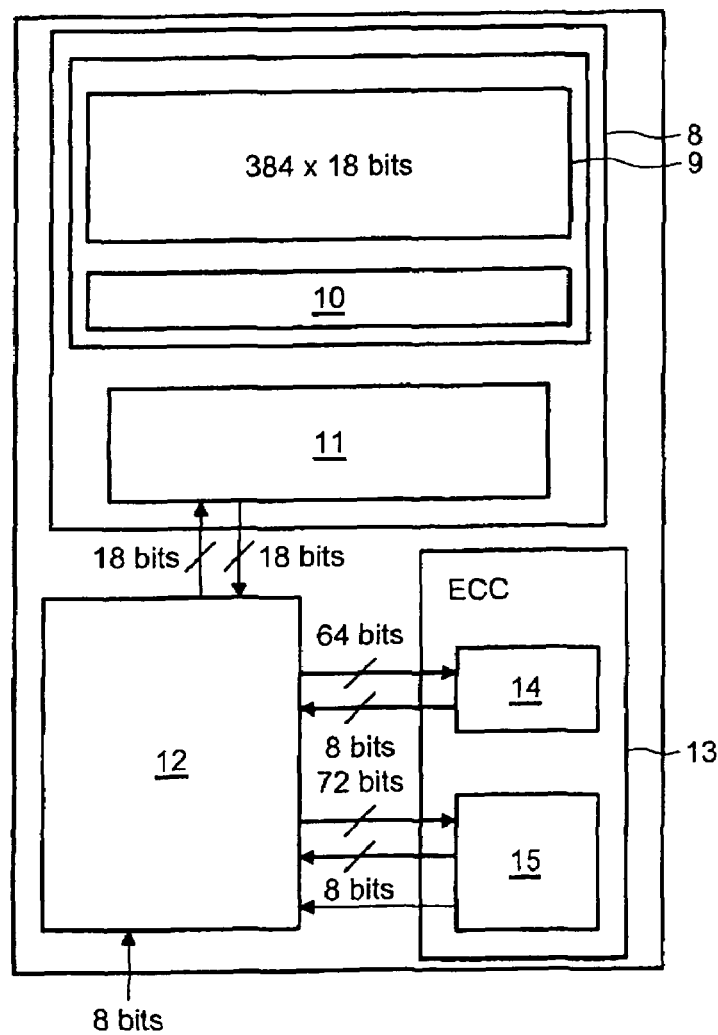
FIG. 4 is a block diagram illustrating the general structure of a non-volatile memory device according to the invention.

There now follows a description with reference to FIG. 4 of the architecture of a non-volatile memory device according to the invention. The device mainly comprises an analog core and a digital core. The analog core, referenced 8, comprises: a matrix of non-volatile memory cells 9 associated with row and column addressing decoders, read amplifiers and voltage reference sources; charge pumps 10 able to generate a high voltage for the programming and erasing of the memory cells; and a memory controller 11 duly programmed to drive the analog core 8 and in which are stored cell programming and erase algorithms.

The digital core comprises: a data control block 12 for controlling the operating modes of the memory and incorporating the memory refresh algorithm for periodically reprogramming the cells that have been subject to a loss of charges, as well as an algorithm for decoding and reorganizing data bits in redundant form; and an error correction block ECC 13 which comprises an encoding block 14 and a data decoding block 15. As is reviewed below, the error correction block 13 incorporates a register (not shown) for temporarily storing the data manipulated by the ECC block 13. For example, in a particular embodiment, by no means limiting, the matrix of non-volatile memory cells 9 is a 384×18-bit matrix.

According to this type of network of memory cells, the data is stored in the form of a set of 18-bit words. Also, based on external data delivered by an 8-bit bus, the data control block 12 organizes this data so as to deliver it to the analog core 8 in the form of successive words of 18 bits. Moreover, the error correction block 13 is designed to manipulate the data in the form of a block of 64 bits.

Figure 5:
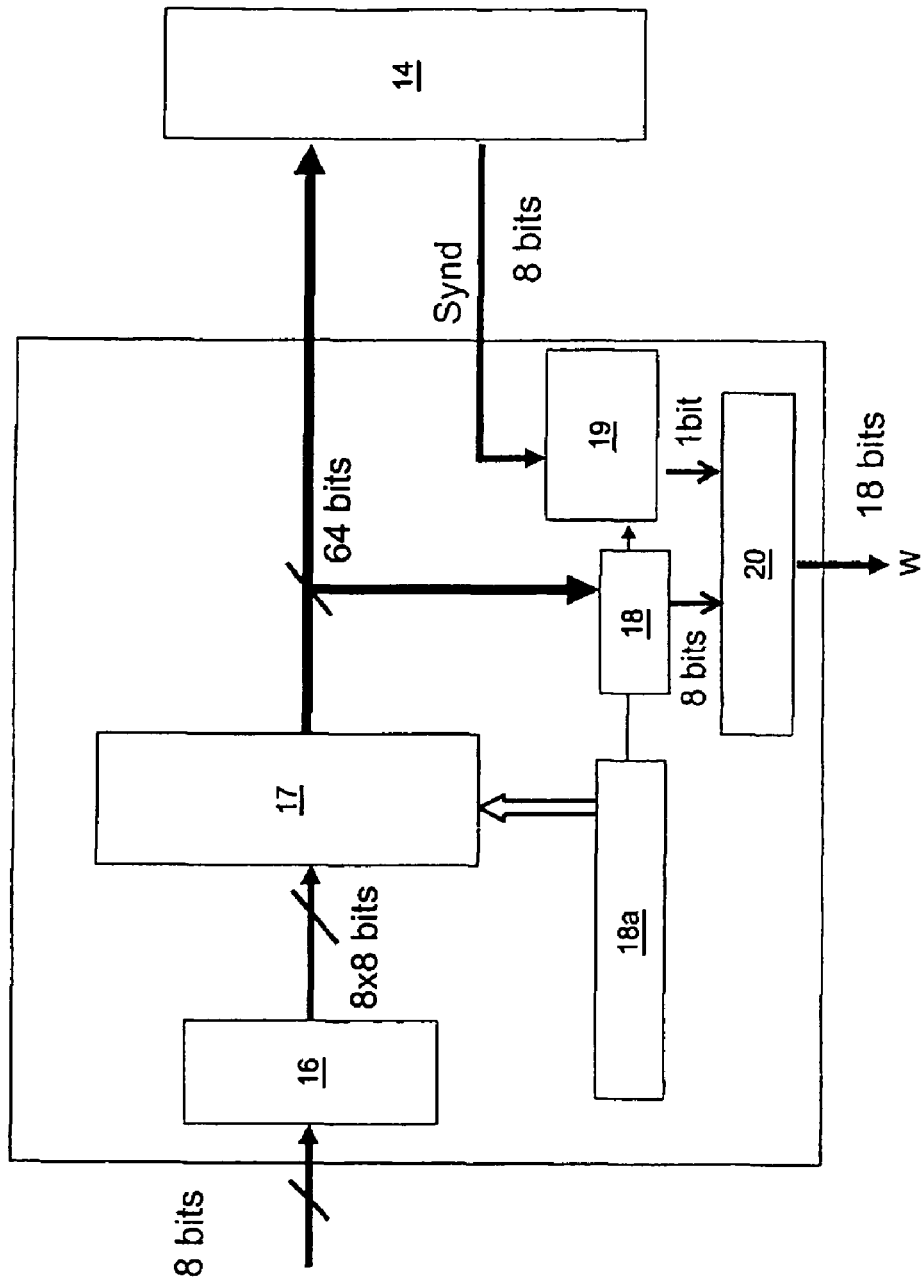
FIG. 5 illustrates the architecture of a part of the data control block.

Also, referring to FIG. 5, the data control block 12 comprises a multiplexer 16 which, based on incoming 8-bit words, delivers to a 64-bit register 17, eight successive 8-bit words. These duly organized bits can be delivered to the encoding block 14 under the control of a logic circuit 18a.

Advantageously, the error correction block 13 incorporates a Hamming code type error correcting code. Such a code is well known to those skilled in the art. It will not therefore be described in detail below. It will, however, be noted that it consists mainly in generating, by encoding, from eight words of 8 bits extracted from the register 17, a signature or syndrome "Synd" which is intended, when checking the integrity of the data, to be decoded, with the corresponding data extracted from the network of memory cells to ensure that errors are detected and these errors are corrected.

Figure 6:
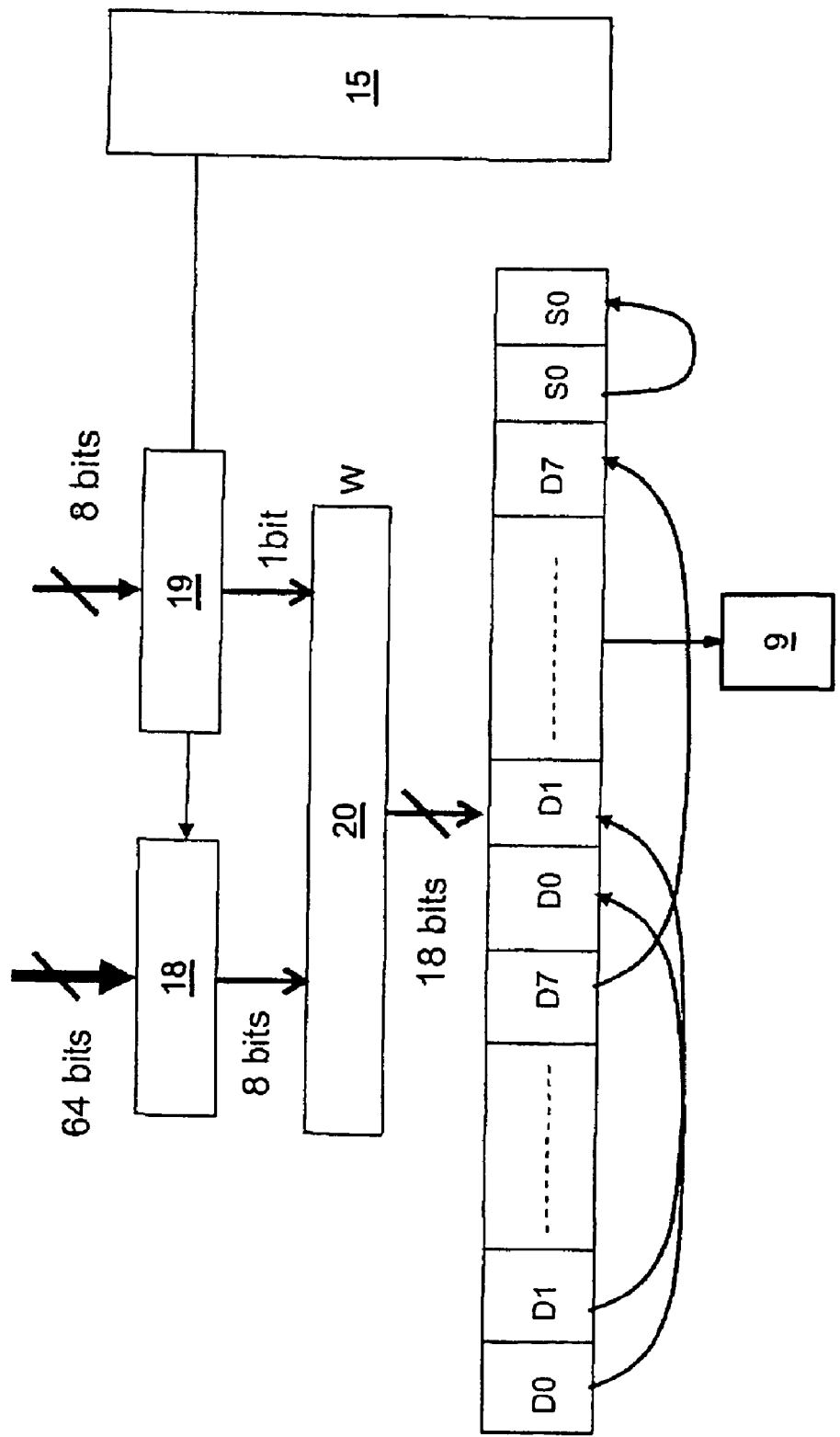
FIG. 6 is a block diagram of the data control block illustrating the copying of the data to be stored in redundant form.

Referring also to FIG. 6, from the data extracted from the register 17, which is presented in the form of eight words of 8 bits, and 8 signature bits respectively corresponding to the signatures of the eight words, the data control block 12 multiplexes the data and multiplexes the signatures by means of corresponding multiplexing/demultiplexing blocks 18 and 19 to recover, for each word, 8 data bits D0, D1, ..., D7, and one signature bit S0. A processing stage 20 then proceeds to generate an 18-bit word by redundantly copying the data bits D0, D1, ... D7 and the signature bit into a single 18-bit word. This duly created word W is then stored in memory in the matrix of cells 9.

It will be noted that the generation of the word W in the form of a block of 18 bits is due to the characteristics of the network of memory cells which, as indicated previously, is a 384×18-bit matrix. The number of bits of the word W will be adapted accordingly if a matrix of different capacity is used.

It will also be noted that, as shown in FIG. 6, each word W is organized such that two identical data bits cannot be arranged side by side so that an error affecting two juxtaposed cells of the matrix 9 cannot affect the two data bits that correspond to the same information.

Figure 7:
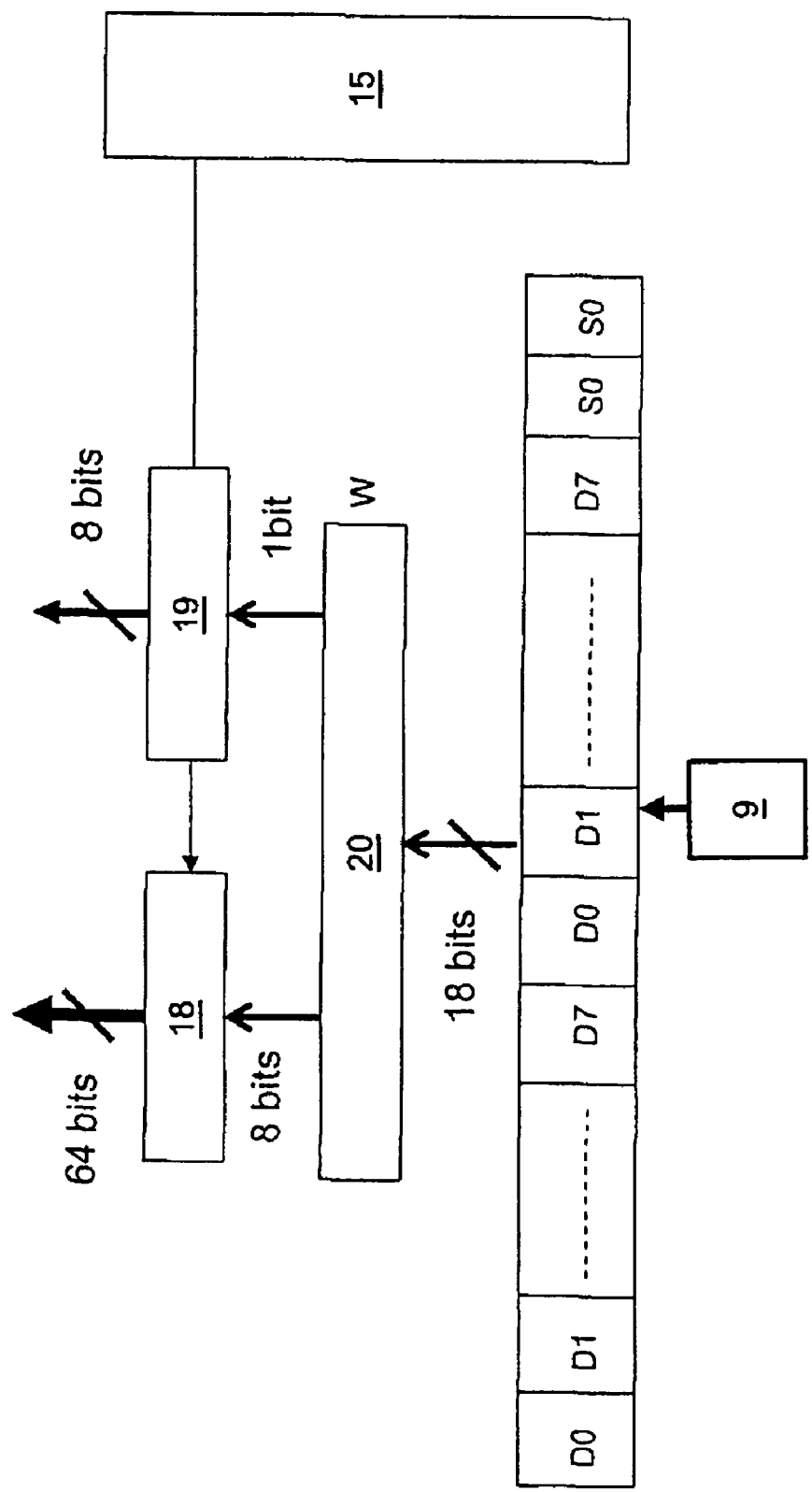
FIG. 7 is a block diagram of the data control block illustrating error correction in redundant data read.
Figure 8:
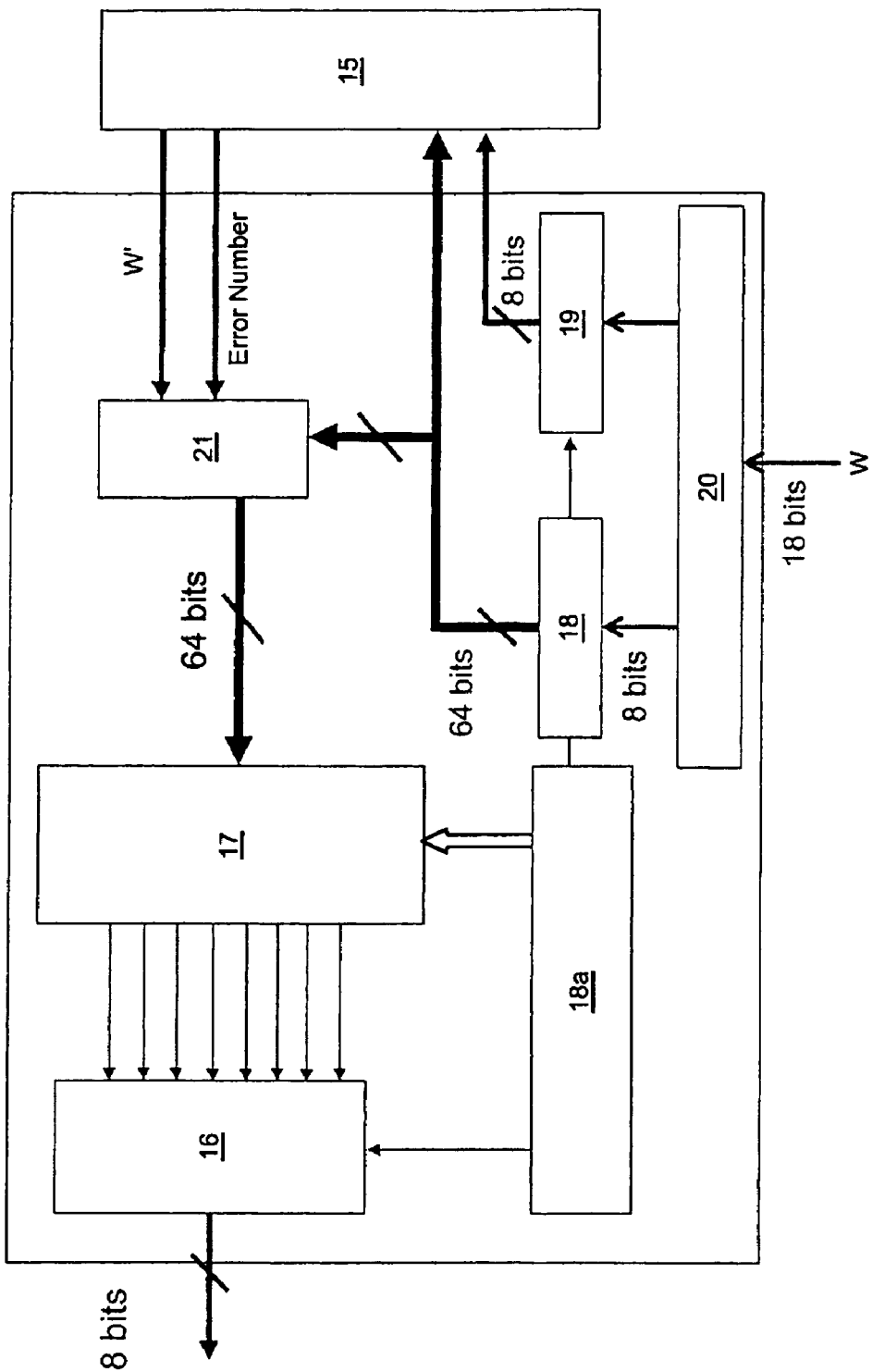
FIG. 8 is a diagram illustrating the operation of the data control block and of the error correction block for reading data.

As illustrated in FIGS. 7 and 8, on reading, the word W extracted from the network of memory cells 9 is presented as input to the processing stage 20 in order, on the one hand, to detect the presence of one or more errors in the word W by performing a logic operation, for example a logical OR between two redundant bits, and reorganizing the data in order to deliver to the multiplexer/demultiplexer 18 and 19 eight words of 8 bits and 8 corresponding signature bits.

This 64-bit data stream is transmitted to the decoding stage 15 of the ECC block 13, where the signatures and the corresponding data are decoded in order, on the one hand, to detect the presence of an error and, on the other hand, to ensure its correction. The corrected word W' is then delivered to a multiplexer 21 to replace, in the stream of eight words of 8 bits, the corrupted word with the corrected word. After correction, the corrected data stream is transmitted to the register 17. The eight words of 8 bits are then transmitted in parallel to the multiplexer 16 to be successively delivered as output from the memory device.

It will, however, be noted that the error decoding block 13 is designed to correct an error or to ensure the detection of two errors. The decoding stage then delivers to the multiplexer 21 a corrected word W' and a number of errors "Error Number".

The above description detailed the procedure for programming the memory network and the recovery of the data from this network of cells.

As indicated previously, the stored data is stored in redundant form and is associated with a signature, which enables corrupted information to be recovered using, on the one hand, the storage of the data in redundant form and, on the other hand, the application of an error correction algorithm.

The retention of the data in the network of cells is moreover improved by carrying out a periodic refresh of the stored data.

Figure 9:
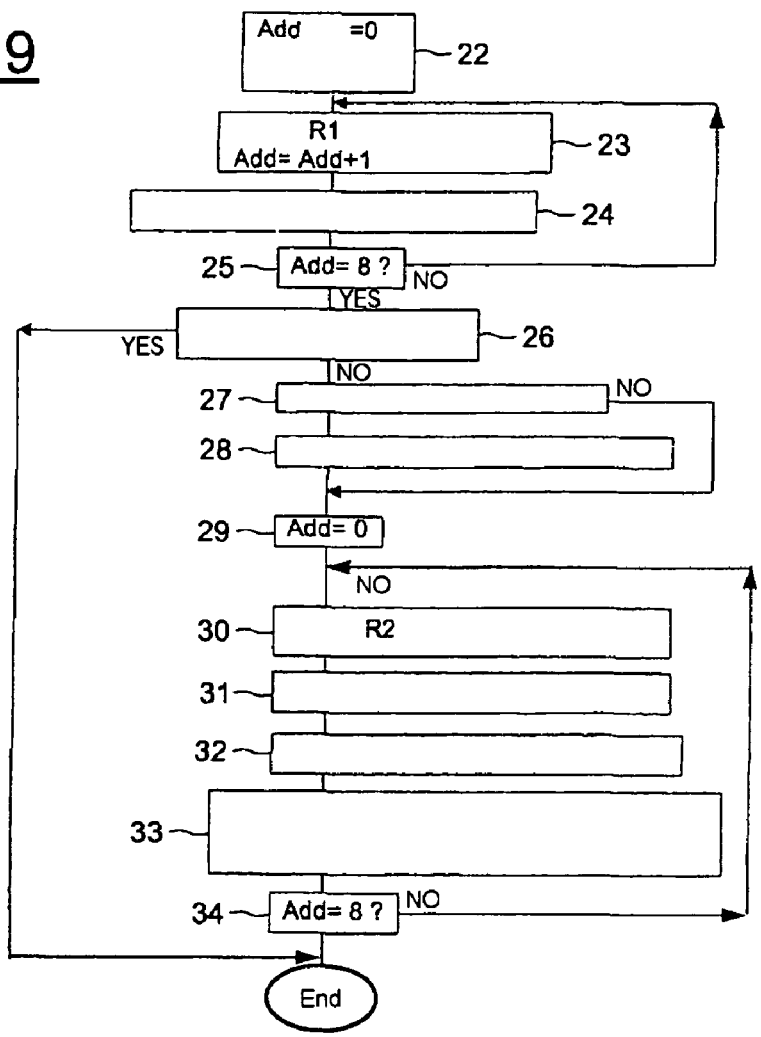
FIG. 9 is a flow diagram illustrating the main phases of the refresh algorithm used to detect the charge losses and reprogram the cells for which a charge loss has been detected.

By referring to FIGS. 3 and 9, this refresh procedure is based on a read under extra constraint of the cells in order to detect a loss of charges and a comparison of the result of the read with a read under standard conditions in order to detect a corruption in the stored information.

With reference to FIG. 9, the procedure for refreshing the memory cells comprises a first phase I of reading cells under standard constraint followed by a second phase II of comparing the result of this first read with a corresponding result obtained by reading cells under extra constraint. The first phase I comprises comparing the read current of each cell with the reference current $I_{ref}$ (FIG. 3) which makes it possible to provide a discrimination between a low logical level and a high logical level. This first phase begins with an initialization step 22 during which an addressing counter "Add" is initialized at zero. During the next step 23, a first word of 8 bits is read by comparing the read current with the reference current $I_{ref}$ in order to have the value of the stored word. During this step 23, the address counter Add is incremented. The measurement result R1 is then stored in the register of the error correction block ECC (step 24). The steps 23 and 24 are repeated until eight consecutive words have been read (step 25). In the next step 26, the decoding stage 15 of the error correction block decodes the signature and the words read. This done, if the number of errors is greater than the error correction capability of the ECC block, this is detected. Otherwise, the ECC block analyses if it is possible, in particular because of the number of errors detected, to correct the error (step 27). If such is the case, the error is corrected and the corrected word is stored in the register of the ECC block (step 28). The addressing counter is then reset to zero (step 29). If error correction is not possible, the procedure goes directly back to step 29.

The second phase II is then implemented. This phase begins with a first step 30 during which the words are successively read under extra constraint. In other words, during this step 30, the read currents are compared to a charge loss detection threshold current value $I_{thresh}$ (FIG. 3). In the next step 31, the result R1 of the read performed in the preceding phase I is transformed into an 18-bit result. The result R1 of the read carried out in the step 30 is then compared to the converted result R2 (step 32). During the next step 33, the bits of the words for which the current is situated between the standard reference current $I_{ref}$ and the charge loss detection threshold value $I_{thresh}$ are reprogrammed and the address counter is incremented. The steps 30, 31, 32 and 33 are then repeated until the eight words have been analyzed (step 34). Another block of eight words of 8 bits, and the corresponding signatures, are then refreshed.

It is thus possible to compensate the charge losses likely to appear in the floating gate, in particular due to a "tunneling" effect through a relatively thin gate oxide layer. Consequently, with the invention, it is possible to maintain a data retention time of the order of a number of years, even using gate oxide layers with a thickness of the order of 50 Angstroms.

It will be noted finally, that, according to the invention, a specific programming procedure is advantageously implemented, during which, after writing data into memory, a check is carried out to ensure that the data has been correctly written.

Figure 10:
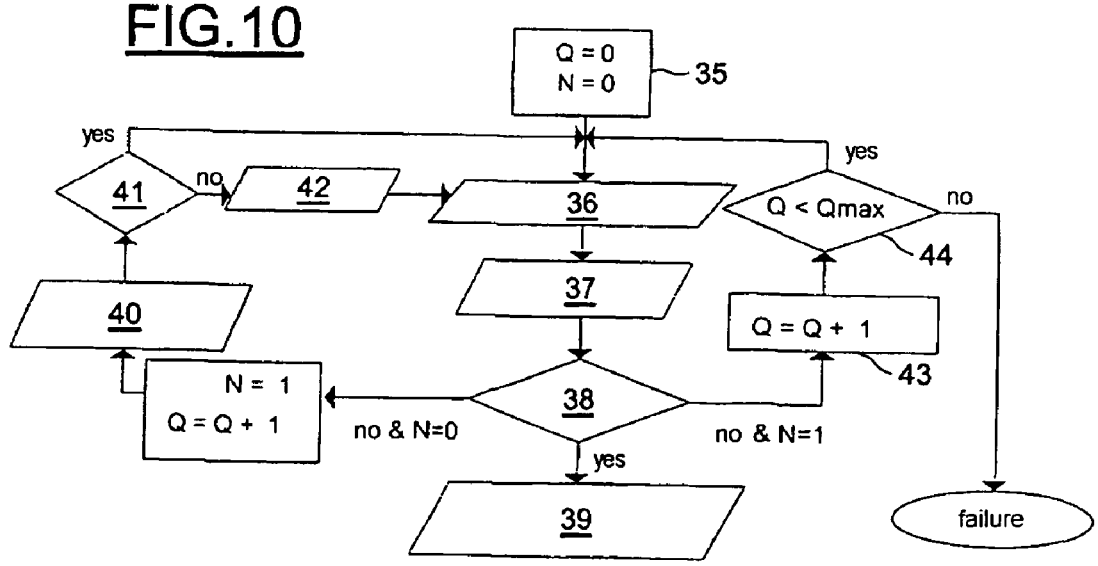
FIG. 10 is a flow diagram illustrating the main phases of the algorithm for programming the non-volatile memory device according to the invention.

An exemplary embodiment of such a programming method will now be described with reference to FIG. 10. This procedure begins with a first step 35 during which two counters N and Q are initialized at zero. In the next step 36, the cells are programmed, conventionally, either by using a hot electron type programming, or by a Fowler-Nordheim type programming. In the next step 37, the cells are read under extra constraint, that is, by comparing the read current of the floating-gate transistors with the reference current $I_{thresh}$ (FIG. 3). A check is then carried out to ensure that the programming has been correctly completed by comparing the result of the read with the expected result (step 38). If the programming has been correctly completed, an additional programming is preferably carried out, of rapid type, which consists in rewriting the same data into memory, so as to further increase the level of charges stored in the floating gates (step 39). However, if the programming is incorrect, a repeat programming is attempted. Thus, if the counter N is at zero, this counter N is set at 1 and the counter Q is incremented. A standard read is then carried out, by comparing the read current with the reference current $I_{ref}$ (step 40). The result of this conventional read (step 41) is then checked. If the programming has been correctly completed, the procedure returns to the preceding step 36. Otherwise, a new programming of the memory cells is carried out so as to compensate the residual charges present in the floating gates by applying a compensation voltage to the contact PC1 of the first active area (FIG. 2a) of each cell. In other words, the aim, during this step, is to facilitate programming. Thus, during this step 42, the threshold voltage is offset towards the initial threshold voltage of the transistors. The procedure is then continued with the preceding step 36 for the actual programming of the cells.

It will be noted that the steps 39 to 42 are carried out only once.

In practice, if, during the preceding step 38, it is observed that the programming is incorrect and that the counter N is set to 1, indicating that the steps 40, 41 and 42 have already been carried out once, in the next step 43, the counter Q is incremented. In the next step 44, the count value is compared with a threshold value $Q_{max}$, for example set at 7. If the count value of the counter Q remains below the threshold value $Q_{max}$, the procedure returns to the preceding step 36 in order to attempt a new programming. Otherwise, it is assumed that the programming has ended in failure.

According to the invention described above, a refresh of the non-volatile memory device is periodically applied, together with an error correction and a check on the integrity of the stored data based on a redundant programming of the data. This process is implemented when the device is activated or, in other words, when the memory is in operation. It thus makes it possible to ensure that the level of charges stored remains adequate, even when the thickness of the gate oxide is such that "tunneling" phenomena are likely to appear. This ensures in particular that, before the memory is switched off, the programmed cells all have a minimum charge level and that their read current is thus greater than the threshold value $I_{resh}$.

Increasing the charge level of the programmed cells thus provides a way of retaining stored information, when the memory is switched off, even in the event of charge losses by "tunneling". The retention capacity of the memory cells is consequently increased considerably, to several years, without the programmed information being corrupted.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A non-volatile memory device, comprising:
a network of non-volatile memory cells each comprising a floating-gate transistor, said network of cells for storing data in the form of a set of data words;
a read circuit which performs a first and second read of the memory cells to generate corresponding first and second read currents;
a comparison circuit which compares the first read current with a first threshold value enabling a discrimination between a high logical level and a low logical level, compares the second read current with at least one second charge loss detection threshold value greater than the first threshold value, and compares words resulting from the first and second carried out reads to detect loss of charges; and
a reprogramming circuit which reprograms those cells for which a loss of charges has been detected so as to restore the level of stored charges;
wherein the charge loss detection threshold value is a read current value between a programmed cell current value and a nominal read current value.

2. The device according to claim 1, wherein the read circuit comprises means for reading cells by comparing a cell read current with a threshold value enabling a discrimination between a stored high logical level and a stored low logical level and means for comparing a data word read by comparing the read current with said first threshold value and a same data word read by comparing the read current with at least one second charge loss detection threshold value greater than the first threshold value.

3. The device according to claim 1, further comprising an error correction block comprising an encoding block for generating a signature for a set of words to be stored in the memory cells, said signature being stored in the network of memory cells, and a decoding block for decoding said set of words and said corresponding signature.

4. A non-volatile memory device comprising:
a network of non-volatile memory cells each comprising a floating-gate transistor, said network of cells for storing data in the form of a set of data words;
means for periodically detecting losses of charges stored in the memory cells;
means for reprogramming the cells for which a loss of charges has been detected so as to restore the level of stored charges; and
an error correction block, wherein the error correction block comprises an encoding block for generating a signature for a set of words to be stored in the memory cells, said signature being stored in the network of memory cells, and a decoding block for decoding said set of words and said corresponding signature.

5. The device according to claim 4, further comprising a data control block which communicates with the error correction block and with the network of memory cells to format data.

6. The device according to claim 5, wherein the data control block comprises means for generating the data words stored by copying, in redundant form, the data to be stored and the corresponding signatures according to characteristics of the network of memory cells.

7. The device according to claim 6, further comprising means for correcting errors in the stored words extracted from the network of cells by applying a logical operation between the redundant data.

8. A method of programming a non-volatile memory device comprising a network of non-volatile memory cells each comprising a floating-gate transistor, according to which the data is written into memory in the form of a set of data words, comprising:
periodically detecting losses of charges stored in the cells; and
rewriting the data in the cells for which a loss of charges has been detected so as to restore the level of charges stored;
wherein, for each word, the charge losses are detected by: carrying out a first read of the cells by comparing the read current with a first threshold value enabling a discrimination between a high logical level and a low logical level; carrying out a second read of the cells by comparing the read current with at least one second charge loss detection threshold value greater than the first threshold value; and comparing the words resulting from the first and second carried out reads; and
wherein the charge loss detection threshold value is a read current value between a current value corresponding to a programmed cell and a nominal read current value.

9. A method of programming a non-volatile memory device comprising a network of non-volatile memory cells each comprising a floating-gate transistor, according to which the data is written into memory in the form of a set of data words, comprising:
periodically detecting losses of charges stored in the cells; and
rewriting the data in the cells for which a loss of charges has been detected so as to restore the level of charges stored;
wherein, for each word, the charge losses are detected by: carrying out a first read of the cells by comparing the read current with a first threshold value enabling a discrimination between a high logical level and a low logical level; carrying out a second read of the cells by comparing the read current with at least one second charge loss detection threshold value greater than the first threshold value; and comparing the words resulting from the first and second carried out reads; and
wherein, prior to the second read of the cells, an error correction algorithm is applied to correct the errors contained in the data words stored, the comparison step being carried out by comparing the corrected words and the words resulting from the second read.

10. The method according to claim 9, wherein the error correction algorithm is applied by encoding the data to be stored so as to generate a signature of said data and by decoding the signature and the corresponding data on reading.

11. The method according to claim 8, wherein programming of the data in memory comprises:
writing the data into the memory cells; and
checking the programming by reading the data written by comparing the read current with a charge loss detection threshold value.

12. The method according to claim 11, wherein, if charge losses are detected, the written data is read a second time, by comparing the read current with a first threshold value enabling a discrimination between the high logical level and the low logical level.

13. A method of programming a non-volatile memory device comprising a network of non-volatile memory cells each comprising a floating-gate transistor, according to which the data is written into memory in the form of a set of data words, comprising:
periodically detecting losses of charges stored in the cells; and
rewriting the data in the cells for which a loss of charges has been detected so as to restore the level of charges stored;

wherein programming of the data in memory comprises:
writing the data into the memory cells; and
checking the programming by reading the data written by comparing the read current with a charge loss detection threshold value;
wherein, if charge losses are detected, the written data is read a second time, by comparing the read current with a first threshold value enabling a discrimination between the high logical level and the low logical level; and
wherein, in the case of a programming fault, the data is rewritten in the cells by applying a compensation voltage to active areas of the non-volatile memory device to which the charges stored in the floating gates are respectively transferred, on erasing the cell.

14. A method of programming a non-volatile memory device comprising a network of non-volatile memory cells each comprising a floating-gate transistor, according to which the data is written into memory in the form of a set of data words, comprising:
periodically detecting losses of charges stored in the cells; and
rewriting the data in the cells for which a loss of charges has been detected so as to restore the level of charges stored;
wherein programming of the data in memory comprises:
writing the data into the memory cells; and
checking the programming by reading the data written by comparing the read current with a charge loss detection threshold value;
wherein, after writing data into the cells and checking the programming, an additional programming of the data written is carried out so as to increase the level of charges stored in the floating gates.

15. A non-volatile memory device, comprising:
a matrix of non-volatile memory cells, each cell being of a floating gate type which stores charge indicative of logic state;
a read circuit that reads individual non-volatile memory cells to detect a loss of stored charge in those cells, wherein the read circuit comprises:
a circuit for reading a current of an individual cell, and comparing the read current to a first current threshold, which discriminates between low and high logic state, and a second current threshold, which is greater than the first threshold; and
a programming circuit, responsive to read circuit detection of a loss of stored charge, which reprograms such non-volatile memory cells for which loss of stored charge is detected so as to restore charge, wherein the programming circuit reprograms that individual cell if the read current is between the first and second thresholds.

16. The device of claim 15 wherein the read circuit comprises:
a circuit for reading a current of an individual cell, and comparing the read current to a current threshold which discriminates between low and high logic state so as to identify stored logic state of the individual cell;
an error detection circuit which detects whether the identified stored logic state is in error; and
an error correction circuit which correct the detected error.

17. The device of claim 16 wherein the programming circuit reprograms that individual cell with the error corrected logic state.

18. A method for programming a non-volatile memory device comprising a matrix of non-volatile memory cells, each cell being of a floating gate type which stores charge indicative of logic state, comprising:
reading individual non-volatile memory cells to detect a loss of stored charge in those cells, wherein reading comprises:
reading a current of an individual cell; and
comparing the read current to a first current threshold, which discriminates between low and high logic state, and a second current threshold, which is greater than the first threshold; and
responsive to read circuit detection of a loss of stored charge, reprogramming such non-volatile memory cells for which loss of stored charge is detected so as to restore charge, wherein reprogramming comprises reprogramming that individual cell if the read current is between the first and second thresholds.

19. The method of claim 18 wherein reading comprises:
reading a current of an individual cell; and
comparing the read current to a current threshold which discriminates between low and high logic state so as to identify stored logic state of the individual cell;
the method further comprising:
detecting whether the identified stored logic state is in error; and
correcting the detected error.

20. The method of claim 19 wherein reprogramming comprises reprogramming that individual cell with the error corrected logic state.

21. A non-volatile memory device, comprising:
a matrix of non-volatile memory cells, each cell being of a floating gate type which stores charge indicative of logic state;
a programming circuit operating to program logic states into individual memory cells of the matrix, the programming circuit storing charge of a desired logic state in each memory cell, and comprising a read circuit that reads the logic state of each programmed individual non-volatile memory cell in comparison to an expected logic state;
wherein, if the read logic state matches the expected logic state, the programming circuit performs an additional programming of the same logic state into the memory so as to further increase a level of charge stored by the memory cell; and
wherein, if the read logic state does not match the expected logic state, the programming circuit performs a repeat programming of the same logic state into the memory.

22. A method for programming a non-volatile memory device comprising a matrix of non-volatile memory cells, each cell being of a floating gate type which stores charge indicative of logic state, comprising:
programming logic states into individual memory cells of the matrix by storing charge of a desired logic state in each memory cell;
reading the logic state of each programmed individual non-volatile memory cell;
comparing the read logic state to an expected logic state;
if the read logic state matches the expected logic state, then performing an additional programming of the same logic state into the memory so as to further increase a level of charge stored by the memory cell; and
if the read logic state does not match the expected logic state, then performing a repeat programming of the same logic state into the memory.

* * * * *